(12) United States Patent
Inoguchi (10) Patent No.: US 7,579,628 B2
(45) Date of Patent: Aug. 25, 2009

(54) BACKLIGHT DEVICE FOR LIQUID CRYSTAL DISPLAY INCLUDING A PLURALITY OF LIGHT EMITTING DIODES WITHIN THEIR OWN CONCAVES ALIGNED IN A STRAIGHT LINE WITHIN A LARGER CONCAVE

(75) Inventor: Tsukasa Inoguchi, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 301 days.

(21) Appl. No.: 11/254,158

(22) Filed: Oct. 18, 2005

(65) Prior Publication Data

US 2006/0083281 A1   Apr. 20, 2006

(30) Foreign Application Priority Data

Oct. 18, 2004   (JP)   ............................. 2004-303503

(51) Int. Cl.
*H01L 29/26*   (2006.01)
*H01L 31/12*   (2006.01)
*H01L 33/00*   (2006.01)
*H01L 29/267*   (2006.01)
*H01L 29/18*   (2006.01)
*H01L 23/02*   (2006.01)
*H01L 21/00*   (2006.01)

(52) U.S. Cl. ............................. 257/81; 257/80; 257/88; 257/99; 257/678; 438/26; 438/28; 438/106

(58) Field of Classification Search .................. 257/89, 257/81, 82, 99, 88, 98, E33.056–E33.058, 257/80; 438/28, 26; 345/102

See application file for complete search history.

(56) References Cited

U.S. PATENT DOCUMENTS

| | | | | |
|---|---|---|---|---|
| 5,693,962 A | * | 12/1997 | Shi et al. ....................... | 257/89 |
| 5,712,674 A | * | 1/1998 | Doi ............................. | 347/238 |
| 6,608,614 B1 | * | 8/2003 | Johnson ....................... | 345/102 |
| 6,835,960 B2 | * | 12/2004 | Lin et al. ....................... | 257/81 |
| 2001/0046131 A1 | * | 11/2001 | Hoelen et al. ................ | 362/231 |
| 2002/0175352 A1 | * | 11/2002 | Cao ............................ | 257/258 |
| 2003/0020077 A1 | * | 1/2003 | Horiuchi et al. ................ | 257/81 |

(Continued)

FOREIGN PATENT DOCUMENTS

CN   1341966   3/2002

(Continued)

*Primary Examiner*—Wai-Sing Louie
*Assistant Examiner*—Diana C Garrity
(74) *Attorney, Agent, or Firm*—Morrison and Foerster LLP (57) ABSTRACT

A semiconductor light emitting device of the present invention includes a plurality of light emitting elements, a package body for storing the light emitting elements, wiring patterns being electrically connected to the light emitting elements, and Au wires for electrically connecting the light emitting elements and the wiring patterns, the package body including mounting concave portions for storing the respective light emitting elements, and storing concave portion for storing the mounting concave portions and the Au wires, the mounting concave portions being aligned on a linear line and spaced from each other with an equal pitch. In the above arrangement, as the semiconductor light emitting device of the present invention, it is possible to provide a semiconductor light emitting device having a high directional characteristic of emitted light, and a backlight device for a liquid crystal display, the backlight device using the semiconductor light emitting device and having an improved brightness of the emitted light.

39 Claims, 9 Drawing Sheets

U.S. PATENT DOCUMENTS

2004/0066140 A1* 4/2004 Omoto ................ 313/512
2004/0173808 A1 9/2004 Wu

FOREIGN PATENT DOCUMENTS

| CN | 1534355 | * | 10/2004 |
|---|---|---|---|
| DE | 20314966 U1 | * | 1/2004 |
| JP | 11-307818 A | | 11/1999 |
| JP | 2000-294838 A | | 10/2000 |
| JP | 2002-141558 A | | 5/2002 |
| JP | 2003-303936 A | | 10/2003 |
| JP | 2004-311467 A | | 11/2004 |
| TW | 200420854 | | 10/2004 |

* cited by examiner

*PRIOR ART*

FIG. 14

*PRIOR ART*

*PRIOR ART*

BACKLIGHT DEVICE FOR LIQUID CRYSTAL DISPLAY INCLUDING A PLURALITY OF LIGHT EMITTING DIODES WITHIN THEIR OWN CONCAVES ALIGNED IN A STRAIGHT LINE WITHIN A LARGER CONCAVE

This Nonprovisional application claims priority under 35 U.S.C. § 119(a) on Patent Application No. 2004/303503 filed in Japan on Oct. 18, 2004, the entire contents of which are hereby incorporated by reference.

FIELD OF THE INVENTION

The present invention relates to a semiconductor light emitting device as a preferable light source for a liquid crystal display (hereinafter referred as LCD), and a backlight device for an LCD, the backlight device using the semiconductor light emitting device.

BACKGROUND OF THE INVENTION

Conventionally, a cold cathode tube has been used as a light source for a backlight in a display such as an LCD. The cold cathode tube requires a high frequency and high voltage of up to about 2000 Vrms when lighting. Therefore, in a display using the cold cathode tube, safety on insulation for the generated high frequency and high voltage has to be ensured, which requires special attention to careful packaging, insulation, prevention of noise, or handling.

In order to eliminate the need of such attention, it has been considered to use, as the light source instead of the cold cathode tube, a light emitting element such as: (i) a semiconductor laser which does not require such high frequency and high voltage, or (ii) a light emitting diode (hereinafter referred as LED).

Figure 11:
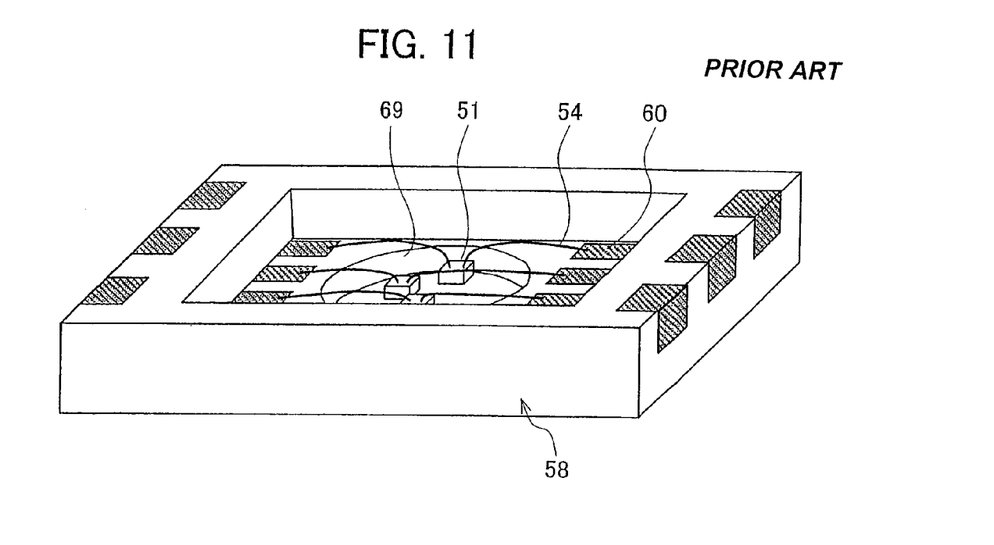
FIG. 11 is a perspective view of a conventional semiconductor light emitting device.

A structure of a known lighting device (semiconductor light emitting device) using such a light emitting element is illustrated in FIG. 11. In FIG. 11, a concave portion 69 is provided so that (i) light reflection can be obtained in a package body 58, (ii) one or plural light emitting element(s) 51 is (are) disposed in the concave portion 69, and (iii) a wiring pattern(s) 60 and the light emitting element(s) 51 are connected using an Au wire(s) 54, respectively.

Figure 12:
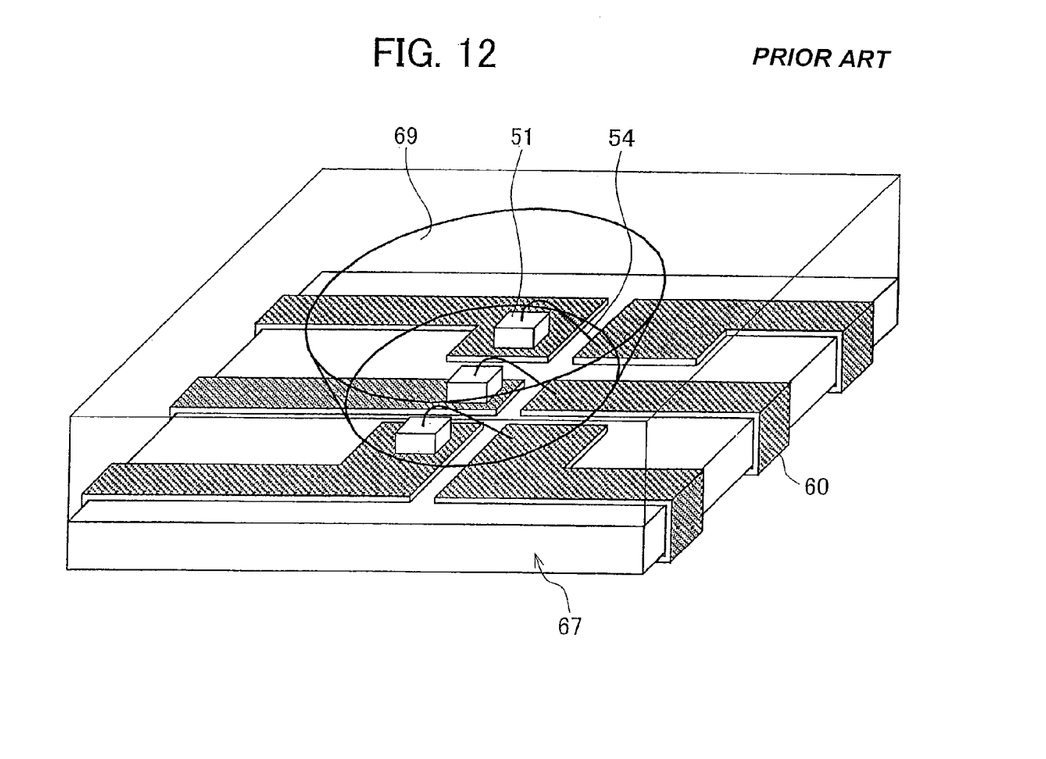
FIG. 12 is a perspective view of another conventional semiconductor light emitting device.

Further, a lighting device having a structure illustrated in FIG. 12 is also known. In the lighting device shown in FIG. 12, the light emitting elements 51 are mounted in the concave portion 69, respectively. The concave portion 69 having a cup shape is provided in a resin substrate 67, in which the wiring patterns 60 are inserted by molding. Further, using the Au wires 54, the light emitting elements 51 are connected to the wiring patterns 60, respectively. Then, the concave portion 69 is sealed with an epoxy resin or the like. There has also been a lighting device having a structure in which electric wiring is wired on a surface of the resin substrate 67 without using the wiring patterns 60.

However, when a plurality of the light emitting elements 51 are disposed, it is impossible to mount all the light emitting elements 51 at the center of the concave portion 69 because a bottom surface of the concave portion 69, where the light emitting elements 51 are to be mounted, generally has a round shape. Therefore, the light emitting elements 51 are mounted on points, i.e., vertexes of a regular triangle or isosceles triangle centered on the center of the concave portion 69. Note that, it is possible to arrange one of the light emitting elements 51 to be disposed at the center point of the concave portion 69 and other light emitting elements 51 to be shifted from the center point.

In a lighting device using fluorescent material for light emission, after a blue color or ultraviolet light emitting element(s) 51 is(are) mounted inside the concave portion 69, a transparent resin is injected into and over the concave portion 69 and hardened. The transparent resin may be an epoxy, a silicone, or the like, in which one or plural fluorescent material(s) required for light emission with an intended color(s) is(are) mixed.

Figure 13:
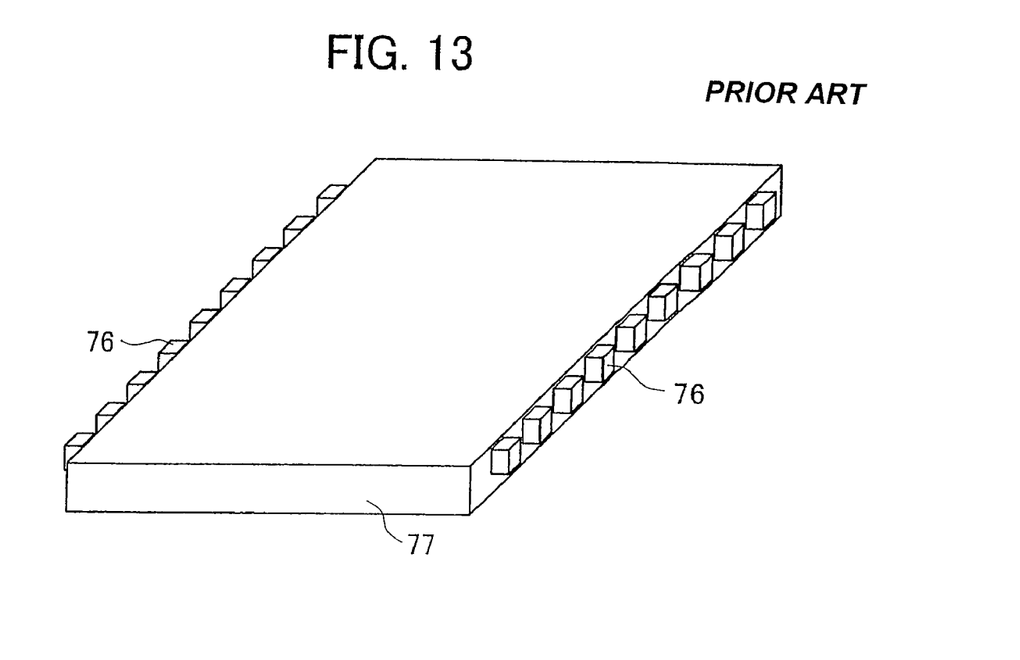
FIG. 13 is a perspective view of a conventional backlight device.
Figure 14:
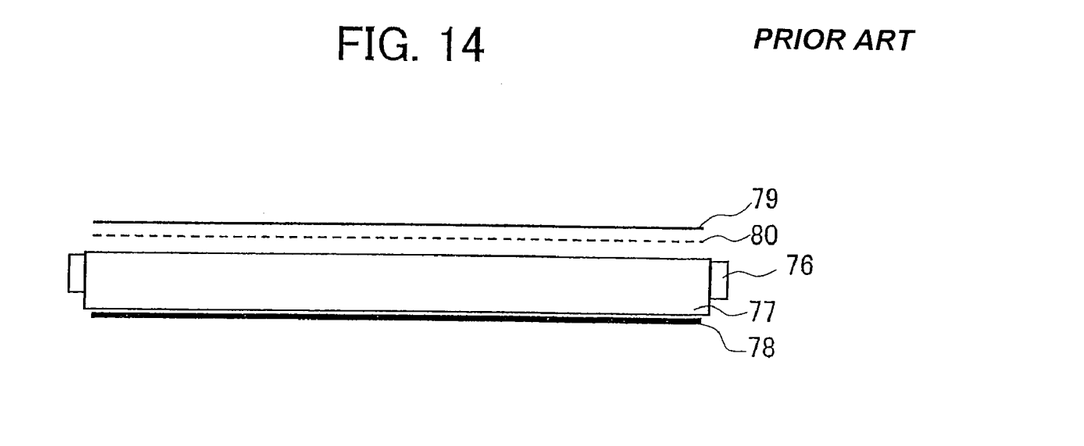
FIG. 14 is a cross-sectional view of a conventional backlight device.

In a backlight unit (backlight device) employing such a lighting device, as illustrated in FIG. 13, a plurality of lighting devices 76, formed with the foregoing method, are disposed so that light from the lighting devices 76 is incident from the side surface to the inside of an optical waveguide 77. The optical waveguide 77 is used for converting the light from dot emission to surface emission. Further, as to the backlight unit, it has been widely known that brightness is enhanced and unevenness of the light is reduced by (i) installing reflecting sheets 78 to side- and bottom-surfaces of the optical waveguide 77 where no lighting device 76 is disposed, and (ii) stacking a diffusion sheet 80, a luminance improving film 79, or the like over a light emitting surface of the optical waveguide 77 as illustrated in FIG. 14.

Figure 15:
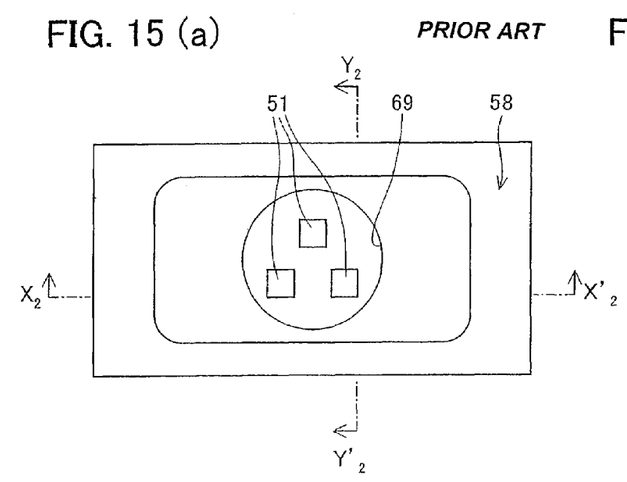
Figure 16:
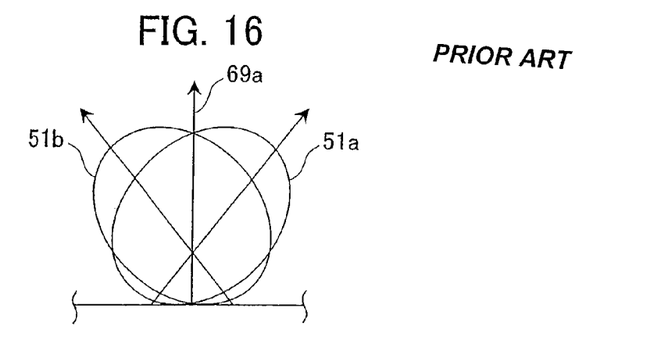
FIG. 16 is a graph representing optical directional characteristics of light beams from light emitting elements of the semiconductor light emitting device illustrated in FIG. 12.

However, according to the conventional structure, as illustrated in FIGS. 15(a) through 15(c), when a plurality of the light emitting elements 51 are mounted in the concave portion 69, it is impossible to dispose all of the light emitting elements 51 at the center of the concave portion 69. This causes variations in distances between the light emitting elements 51 and a sidewall of the concave portion 69 having light reflecting efficiency or light shielding efficiency. Accordingly, as illustrated in FIG. 16, luminance distributions of light beams emitted from the light emitting elements 51, i.e., directional characteristics 51a and 51b, have various gradients with respect to a center axis 69a of the concave portion 69 (see Japanese Unexamined Patent Publication No. 294838/2000 (Tokukai 2000-294838, publication date: Oct. 20, 2000) and Japanese Unexamined Patent Publication No. 303936/2003 (Tokukai 2003-303936, publication date: Oct. 24, 2003).

Figure 17:
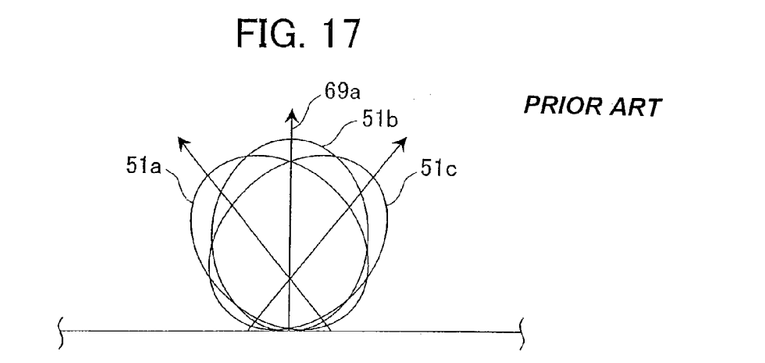
FIG. 17 is a graph representing optical directional characteristics of light beams from light emitting elements of the semiconductor light emitting device illustrated in FIG. 11.

Further, in such a structure that the light emitting elements 51 are positioned on vertexes of a triangle, but not on a linear line (disclosed in Japanese Unexamined Patent Publication No. 307818/1999 (Tokukai 1999-307818, publication date: Jan. 5, 1999), the luminance distributions have gradients in y-direction as well as x-direction. Accordingly, as illustrated in FIG. 17, directional characteristics 51a through 51c are formed in various directions, i.e., in the x-direction and the y-direction with respect to the center axis 69a, due to the positional differences of the light emitting elements 51. When the light emitting elements 51 have three emission colors of RGB, mixture of the colors will be perceived as different colors from different angles.

Figure 18:
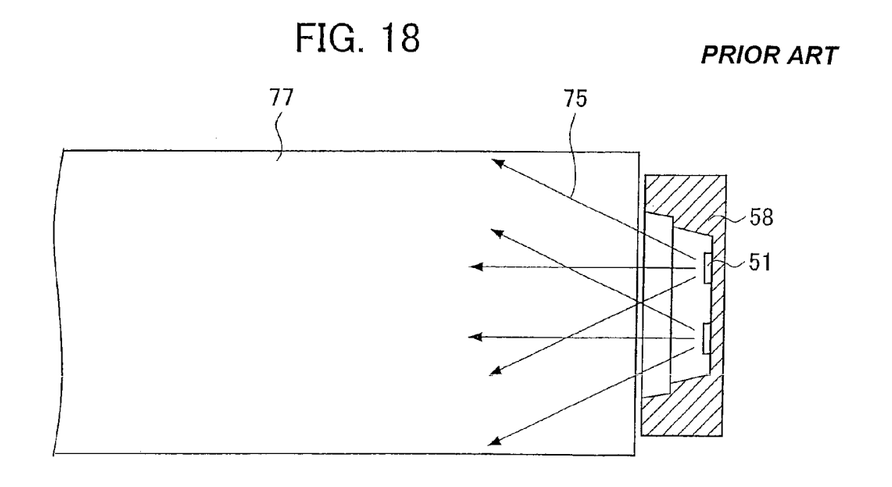
FIG. 18 is a cross-sectional view of a conventional backlight device.

When the conventional lighting device (semiconductor light emitting device) is employed as a light source in a backlight device for an LCD, as illustrated in FIG. 18, the light emitting elements 51 exhibit various directional characteristics to the optical waveguide 77, which converts light into surface emission. This is caused by the positional differences of the light emitting elements 51 as described above. Further, incident light beams 75, which are incident from the light emitting elements 51 on the side surface of the optical waveguide 77, travel in different directions at different angels from a normal to the side surface. Accordingly, luminance efficiency for the light incident on the optical waveguide 77 is reduced.

When light beams of RGB three colors are emitted, the light beams tend to have unevenness in colors due to mixture of the colors. Further, when two or more fluorescent materials are used, a total amount of the fluorescent materials is increased and their transmittance is deteriorated, so that the light brightness is reduced. When a fluorescent material having a long excitation wavelength is used, the fluorescent material absorbs light, which is emitted from another fluorescent material, for excitation. Thus, luminance efficiency is reduced.

SUMMARY OF THE INVENTION

The present invention is made in view of the above problems, and an object of the present invention is to provide a semiconductor light emitting device having a high optical directional characteristic of emitting light, and a backlight device for a liquid crystal display, the backlight device employing the semiconductor light emitting device and having an improved brightness of emitted light.

To attain the foregoing object, a semiconductor light emitting device of the present invention includes a plurality of light emitting elements; a package substrate for storing the light emitting elements; wiring patterns being electrically connected to the light emitting elements; and connecting members for electrically connecting the light emitting elements to the wiring patterns, the package substrate having: first concave portions for storing the respective light emitting elements; and a second concave portion for storing the first concave portions and the connecting members, the first concave portions being aligned on a linear line and spaced from each other with an equal pitch.

According to the arrangement, by aligning and spacing the first concave portions from each other with an equal pitch on a linear line, it is possible to equalize distances between light beams emitted from the light emitting elements and wall surfaces of the first concave portions, and distances between the light beams and wall surfaces of the second concave portions. Accordingly, the light beams emitted from the light emitting elements have a similar optical directional characteristic. This reduces variations in the directional characteristics of the light beams, which has been a problem in a conventional structure.

Further, to attain the foregoing object, the semiconductor light emitting device of the present invention include a plurality of light emitting elements; a package substrate for storing the light emitting elements; wiring patterns being electrically connected to the light emitting elements; and connecting members for electrically connecting the light emitting elements to the wiring patterns, the package substrate having: first concave portions for storing the respective light emitting elements; and a second concave portion for storing the first concave portions and the connecting members, each of the first concave portions being aligned on a linear line parallel to one edge portion of the package substrate and spaced from each other with an equal pitch.

According to the arrangement, by aligning and spacing the first concave portions from each other with an equal pitch on a linear line parallel to the one edge portion of the package substrate, it is possible to equalize distances between light beams emitted from the light emitting elements and wall surfaces of the first concave portions, and distances between the light beams and wall surfaces of the package substrate. Accordingly, the light beams emitted from the light emitting elements have similar optical directional characteristics. This reduces variations in the directional characteristics of the light beams, which has been a problem in a conventional structure.

Thus, by installing the semiconductor light emitting device to an optical waveguide of a backlight device, luminance efficiency of the light beams incident on the optical waveguide can be improved. This is because the light beams have reduced gradients with respect to a light incident surface of the optical waveguide, thereby being projected on the optical waveguide at an approximately square angle from the light incident surface of the optical waveguide.

As a result, with the foregoing structure, the luminance efficiency of the light beams incident on the optical waveguide can be improved. This facilitates guiding more amount of light into the optical waveguide, and enhances the brightness of the light beams emitting from the optical waveguide. Thus, in a backlight device for an LCD, it is possible to set a high brightness of image display in the LCD, so that quality of the image display can be improved.

For a fuller understanding of the nature and advantages of the invention, reference should be made to the ensuing detailed description taken in conjunction with the accompanying drawings.

BRIEF DESCRIPTION OF THE DRAWINGS

FIG. 15(*a*) is a plane view illustrating a conventional semiconductor light emitting device.

FIG. 15(*b*) is a cross-sectional view taken on line X2-X'2 of FIG. 15(*a*).

FIG. 15(*c*) is a cross-sectional view taken on line Y2-Y'2 of FIG. 15(*a*).

DESCRIPTION OF THE EMBODIMENTS

With reference to figures, semiconductor light emitting devices according to embodiments of the present invention are described below.

First Embodiment

Figure 1:
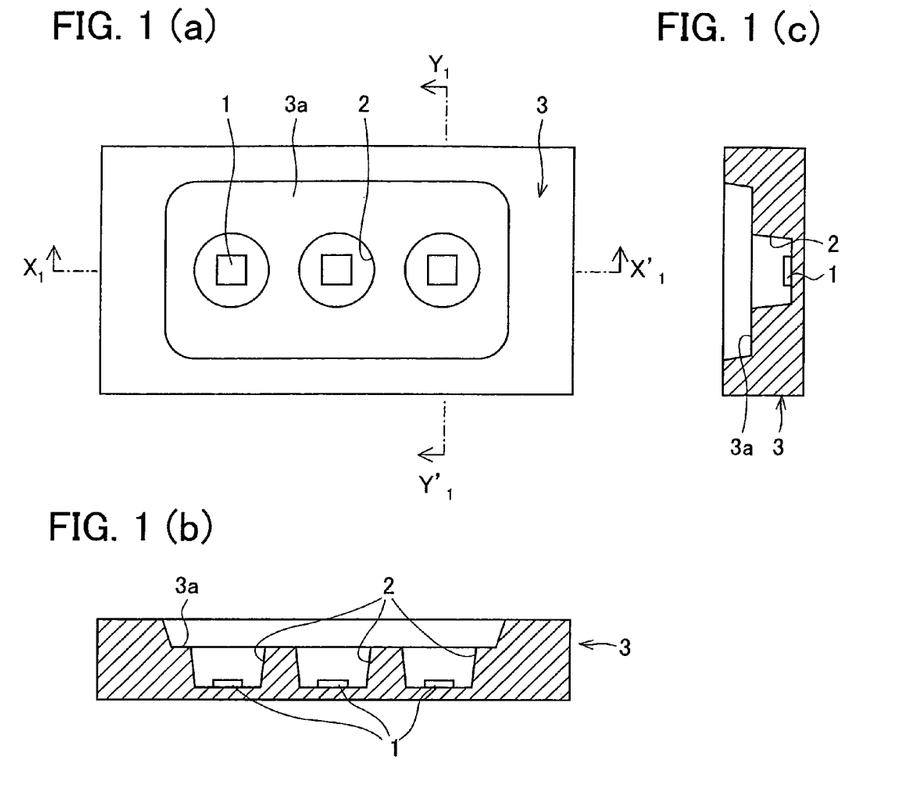
FIG. 1(a) is a plan view illustrating a semiconductor light emitting device according to a first embodiment of the present invention.
FIG. 1(b) is a cross-sectional view taken on line X1-X'1 of FIG. 1(a).
FIG. 1(c) is a cross-sectional view taken on line Y1-Y'1 of FIG. 1(a).
Figure 2:
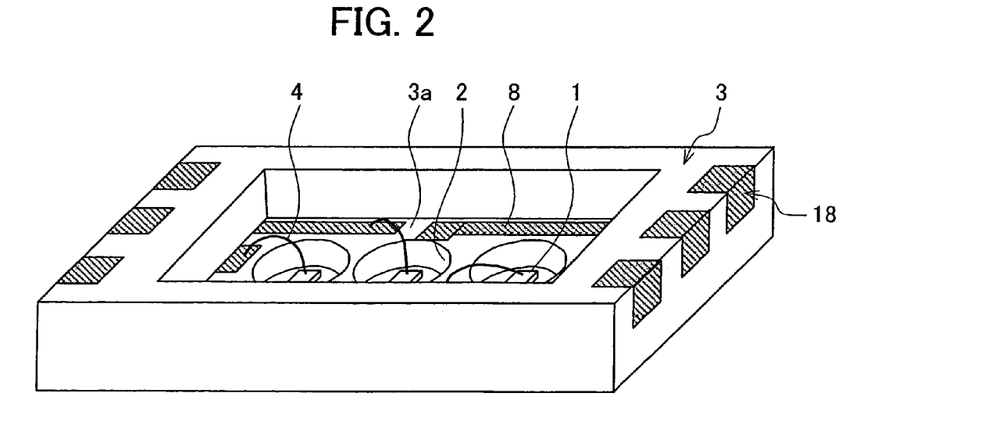
FIG. 2 is a perspective view illustrating the semiconductor light emitting device of the first embodiment.

As illustrated in FIGS. 1 and 2, a semiconductor light emitting device (lighting device) according to one embodiment of the present invention has a plurality of (e.g. three) light emitting elements 1 in a package body 3 used in a semiconductor light emitting device, which is formed in a substantially rectangular plate. Examples of the light emitting element 1 are an LED and a semiconductor laser, which are formed in substantially rectangular solids. The package body 3 may be made of an electrical insulator having good heat conductance. Examples of materials of the package body 3 are: (i) a ceramics such as a silicon carbide (SiC), an alumina (AL$_2$O$_3$), or an aluminum nitride (AlN); (ii) a reinforcing resin such as an epoxy resin reinforced by glass fiber or carbon fiber; or (iii) a metal frame or a material made of a resin which holds the metal frame and reflects light. Regarding brightness and formability, an aluminum nitride is preferable.

The insulator refers to electrically having a resistance (RT) of $10^{10}$ (Ω·cm) or greater, or more preferably $10^{12}$ (Ω·cm) or greater. The good heat conductance refers to having a heat conductivity (RT) of 18 (W/m·k) or greater. It is more effective to have a heat conductivity of 60 (W/m·k) or greater, and most effective to have that of 140 (W/m·k) or greater.

The package body 3 has a storing concave portion (second concave portion) 6 and wiring patterns 8. The storing concave portion 6 has a light outgoing opening formed on a substrate which has electrical insulation and good heat conductivity. Further, the storing concave portion 6 is disposed in a direction consistent with a direction along a thickness of the substrate so as to store Au wires (connecting members) 4, which is described later. The wiring patterns 8 are formed on an inner bottom surface of the storing concave portion 3*a* so as to supply electric power to the light emitting elements 1.

It is preferable that the storing concave portion 6 be provided so that: (i) the bottom surface of the storing concave portion 3*a* is substantially parallel to a surface of the substrate; and (ii) the bottom surface of the storing concave portion 3*a* and the surface of the substrate have similar shapes (i.e., rectangular).

On the bottom surface of the storing concave portion 3*a* of the package body 3, mounting concave portions (first concave portions) 2 are provided in a direction consistent with the direction along the thickness of the substrate. The mounting concave portions (first concave portions) 2 are to contain the light emitting elements 1, respectively.

Further, the wiring patterns 8, which supply electric power to the light emitting elements 1, are formed around the light emitting elements 1 on the bottom surface of the storing concave portion 3*a*. The wiring patterns 8 are formed from the periphery of the bottom surface of the storing concave portion 3*a* toward the edge portion of the package body 3 where the wiring patterns 8 are exposed.

On a top surface of the package body 3 (light incident opening side), and further on the surface of the edge portion of the package body 3, terminal patterns 18 are formed. The terminal patterns 18 perform electrical connection to an outside source. The terminal patterns 18 are formed so as to be electrically connected to the wiring patterns 8, respectively.

Accordingly, through the terminal patterns 18 and the wiring patterns 8, the electric power is supplied to the light emitting elements 1. Further, the terminal patterns 18 and the outer source are electrically connected on the top surface of the package body 3. Thus, even when a radiator heater is attached to the package body 3, i.e., a rear side of the light incident opening, a heat dissipation efficiency of the radiator heater is improved without interposing a wiring substrate between the radiator heater and the package body 3.

The mounting concave portions 2 are disposed so that their center axes are aligned on a linear line, and spaced equally from a pair of inner walls of the storing concave portion 6 (inner walls along a long side of the substrate) (a first distance). Further, it is preferable that the mounting concave portions 2 be equally spaced from each other (with an equal pitch).

The mounting concave portions 2 are disposed so that their center axes are aligned on a linear line, and spaced equally from a pair of inner walls of the storing concave portion 3*a* (inner walls along a long side of the substrate) (a first distance). Further, it is preferable that the mounting concave portions 2 be equally spaced from each other (with an equal pitch).

Further, it is preferable that the mounting concave portions 2 being closest to a pair of other inner walls of the storing concave portion 6 (inner walls along a short side of the substrate) be spaced equally from the inner walls (a second distance). In addition, it is preferable that the second distance be equal to or greater than the first distance.

On the inner bottom surfaces of the mounting concave portions 2, the light emitting elements 1 are mounted so that optical axes of light beams emitted from the light emitting elements 1 will be on the center axes of the mounting concave portions 2, respectively. Further, the light emitting elements 1 are mounted so that the optical axes of light beams emitted from the light emitting elements 1 are parallel to each other and orthogonal to a direction along the inner bottom surfaces of the mounting concave portions 2.

The mounting concave portion 2 may be formed in a taper shape in which a diameter of the mounting concave portion 2 (a width in a direction along the surface of the body 3) becomes gradually greater from its bottom surface toward its opening side (light outgoing opening side). By forming its inner shape in a taper shape, the mounting concave portion 2 will be in a cone shape (conical corn shape, cup structure) which facilitates light to reflect toward the opening. This provides ease in fabrication, and achieves more preferable light reflectivity to a front direction, which is described later.

In order to achieve more preferable light reflectivity to the front direction, it is desirable that reflecting layers having a good light reflectivity e.g. Ag-related plating layers (not shown) be formed on the inner walls of the mounting concave portions 2, respectively. The reflecting layers may be disposed separately from the wiring patterns 8, or may serve as the wiring patterns 8.

Figure 3:
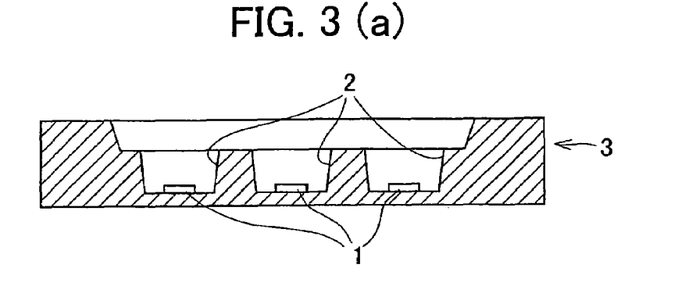
FIG. 3(a) is a cross-sectional view illustrating the semiconductor light emitting device of the first embodiment.
FIG. 3(b) is a graph representing optical directional characteristics of the light beams from the light emitting elements in the semiconductor light emitting device illustrated in FIG. 3(a).
Figure 4:
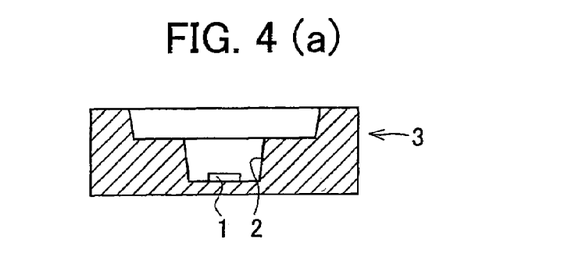
FIG. 4(a) is a cross-sectional view illustrating the semiconductor light emitting device of the first embodiment. The cross-sectional view is taken along a line different in direction with respect to the line taken in FIG. 3(a).
FIG. 4(b) is a graph representing the optical directional characteristics of the light beams from the light emitting elements in the semiconductor light emitting device illustrated in FIG. 4(a).

The following describes functions and effects of the first embodiment of the present invention. When a plurality of the light emitting elements 1 are mounted as shown in FIG. 1, the mounting concave portions 2 are provided as many as the light emitting elements 1. The light emitting elements 1 are disposed at the center of the mounting concave portions 2, respectively. According to this arrangement, the light emitting elements 1 can be spaced more equally from the side surfaces of the mounting concave portions 2 as illustrated in FIG. 3(a), thereby obtaining directional characteristics 11 having no gradient as illustrated in FIG. 3(b). Further, by aligning the plural mounting concave portions 2 on a linear line as shown in FIG. 1 and FIG. 4(a), directional characteristics in both X-direction and Y-direction can be uniformed as illustrated in FIG. 4(b), so that light can be effectively guided to an optical waveguide where the light will be converted into surface emission in the backlight device as described later.

The light emitting elements 1 are bonded for fixation, and electrically connected to the mounting concave portions 2 with Ag-related paste or eutectic crystal. Using the Au wires 4, electrodes on upper surfaces of the light emitting elements 1 are connected to the wiring patterns 8. The wiring patterns 8 may be wired on either (i) the bottom surface of the storing concave portion 3a, which is horizontal to the surfaces of the openings of the mounting concave portions 2, or (ii) a surface which is upper relative to the openings.

Figure 5:
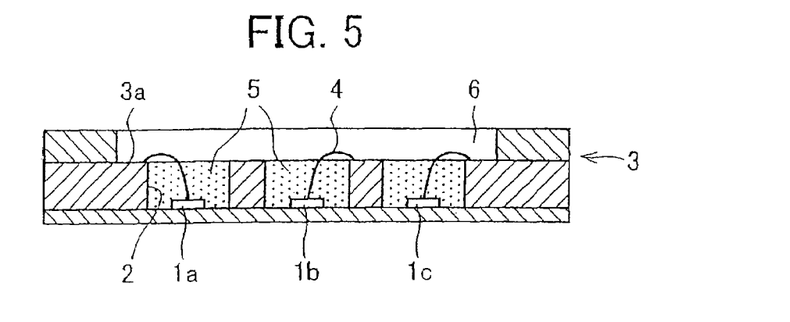
FIG. 5 is a cross-sectional view illustrating the semiconductor light emitting device using one kind of fluorescent material according to the first embodiment.

According to the present embodiment, as illustrated in FIG. 5, sealing resin sections 5 are provided in the mounting concave portions 2 so that surfaces of the sealing resin sections 5 and the bottom surface of the storing concave portion 3a will be horizontal. The sealing resin section 5 is made of a transparent resin (light transmissive resin) such as an epoxy resin, a silicone resin, or the like. According to the present embodiment, as the light emitting elements 1, a red (R) light emitting element 1a, a green (G) light emitting element 1b, and a blue (B) light emitting element 1c are provided. When the sealing resin sections 5 are transparent resin, the mounted red (R) light emitting element 1a, the green (G) light emitting element 1b, and the blue (B) light emitting element 1c emit light beams without changing their colors, so that RGB full colors from the red (R) light emitting element 1a, the green (G) light emitting element 1b, and the blue (B) light emitting element 1c are realized.

Second Embodiment

Figure 6:
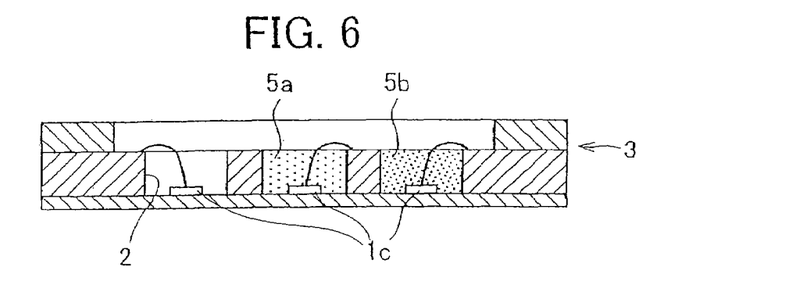
FIG. 6 is a cross-sectional view illustrating a semiconductor light emitting device according to a second embodiment of the present invention.

According to a second embodiment, as the sealing resin section 5, a fluorescent material mixed resin is used instead of the transparent resin described in the first embodiment. As illustrated in FIG. 6, blue color light emitting elements 1c are used. Further, one of the mounting concave portions 2 is set to pass blue light from the blue color light emitting element 1c. Another one of the mounting concave portions 2 is filled with a sealing resin section 5a in which a first fluorescent material is mixed. The first fluorescent material emits green light from blue light emitted from the blue color light emitting element 1c. Further, a further one of the mounting concave portions 2 is filled with a sealing resin section 5b in which a second fluorescent materials is mixed. The second fluorescent material emits red light from blue light emitted from the blue color light emitting element 1c.

According to the second embodiment, each of the fluorescent materials having individual colors will be constituted independently without being mixed, thereby realizing light emission of RGB full colors by using only one kind of lighting element, i.e., blue color light emitting elements 1c.

Note that, as a modification example of the second embodiment, one of the plural mounting concave portions 2 may be emptied or sealed with a transparent resin, so as to pass blue light from the blue color light emitting element 1c. In this arrangement, another one of the mounting concave portions 2 may be filled with a sealing resin section (not shown) in which a third fluorescent material emits yellow light from blue light emitted from the blue color emitting element 1c.

According to the above exemplary modification, by extracting blue light and yellow light independently, white light having high luminance efficiency can be obtained from one kind of light emitting element, i.e., the blue color light emitting elements 1c.

Third Embodiment

Figure 7:
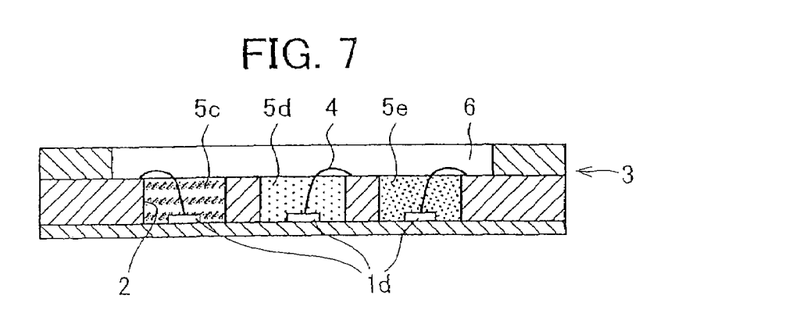
FIG. 7 is a cross-sectional view illustrating a semiconductor light emitting device according to a third embodiment of the present invention.

According to a third embodiment, as the sealing resin section 5, a fluorescent material mixed resin is used instead of the transparent resin described in the first embodiment. As illustrated in FIG. 7, ultraviolet light emitting elements 1d. One of the mounting concave portions 2 is filled with a sealing resin section 5c in which a fourth fluorescent material is mixed. The fourth fluorescent material emits blue light from ultraviolet light emitted from the ultraviolet light emitting element 1d. Another one of the mounting concave portions 2 is filled with a sealing resin section 5d in which a fifth fluorescent material is mixed. The fifth fluorescent material emits green light from ultraviolet light emitted from the ultraviolet light emitting element 1d. Further, a further one of the mounting concave portions 2 is filled with a sealing resin section 5e in which a sixth fluorescent material is fixed. The sixth fluorescent material emits red light from ultraviolet light emitted from the ultraviolet light emitting element 1d.

According to the third embodiment, the mounting concave portions 2 are filled with the fourth fluorescent material, the fifth fluorescent material, and the sixth fluorescent material, respectively, without mixing the different fluorescent materials. By extracting each of the light beams having different colors of RGB independently, light emission of high luminance efficiency is realized in RGB full colors.

Fourth Embodiment

Figure 8A:
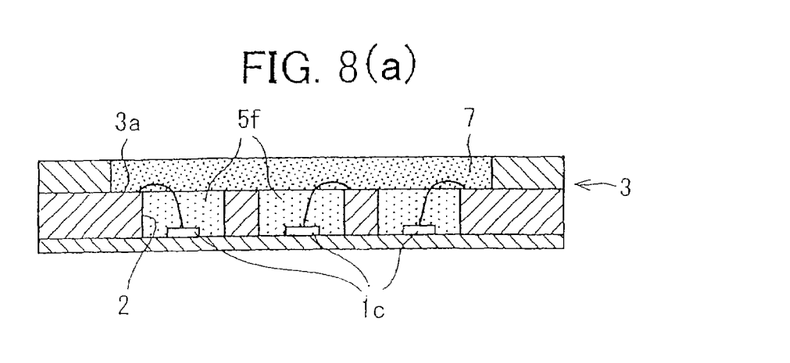
FIG. 8 is a cross-sectional view illustrating a semiconductor light emitting device according to a fourth embodiment of the present invention.
Figure 8B:
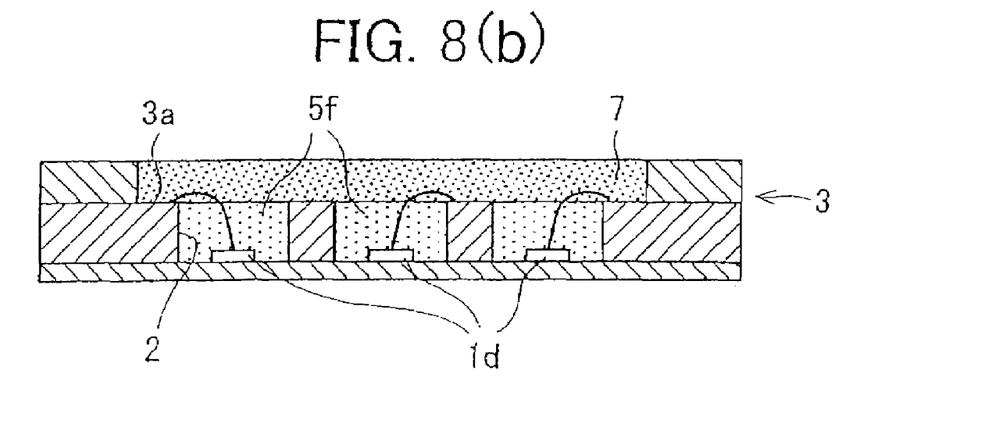

According to a fourth embodiment, a two-layer fluorescent material mixed resin is used instead of the transparent resin described in the first embodiment. As illustrated in FIG. 8a, blue color light emitting elements 1c are used. Alternatively, as shown in FIG. 8b, ultraviolet light emitting elements 1d also may be used. The mounting concave portions 2 are filled with sealing resin sections (first resin layers) 5f formed with a resin in which a seventh fluorescent material is mixed. The seventh fluorescent material has a long excitation wavelength. Further, the storing concave portion 3a, which is provided over the sealing resin sections 5f, is filled with a sealing resin section (second resin section) 7 so that a surface of the sealing resin section 7 will be horizontal to a surface of the package body 3. The sealing resin section 7 is formed with a resin in which an eight fluorescent material is mixed and has an excitation wavelength of a shorter interval than that of the seventh fluorescent material.

Assume a case where a fluorescent material exhibiting an excitation characteristic in a relatively long wavelength band and a fluorescent material exhibiting an excitation characteristic in a short wavelength band are used in combination. In this case, because the fluorescent materials are generally mixed concurrently, the fluorescent material exhibiting the excitation characteristic in the long wavelength band absorbs light emitted from the fluorescent material exhibiting the excitation characteristic in the short wavelength band. Thus, the luminance efficiency is reduced.

However, according to the fourth embodiment, the sealing resin section 7 is provided over the sealing resin sections 5*f* (on the subsequent side of a propagation direction of light beams emitted from the light emitting elements 1). The eighth fluorescent material having the short excitation wavelength is mixed in the sealing resin section 7, and the seventh fluorescent material having the long excitation wavelength is mixed in the sealing resin sections 5*f*. This structure prevents the light emitted from the eighth fluorescent material having the short excitation wavelength from being absorbed by the seventh fluorescent material having the long excitation wavelength. As a result, brightness of light beams emitted from the semiconductor light emitting device 26 can be improved, so that high luminance efficiency can be achieved.

As described above, according to the embodiments, the mounting concave portions 2 are provided for the light emitting elements 1, respectively. With this structure, when two or more fluorescent materials are used, each of the mounting concave portions 2 is used for each of the fluorescent materials having individual colors. Thus, higher luminance efficiency is achieved compared to a case where two or more fluorescent materials are mixed with each other for use.

Fifth Embodiment

Figure 9:
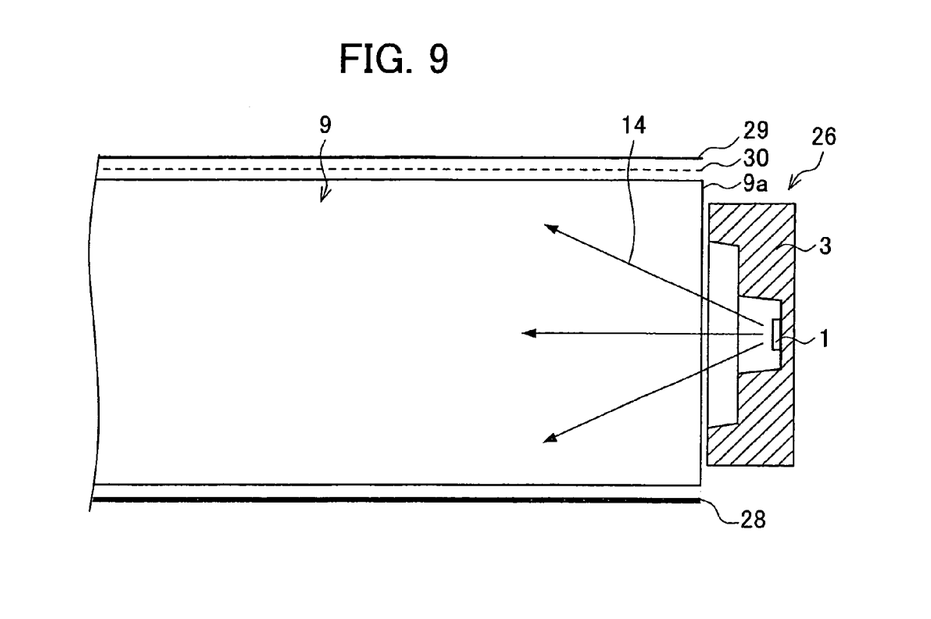
FIG. 9 is a cross-sectional view illustrating substantial parts of a backlight device of the present invention.

According to the present invention, as illustrated in FIG. 9, a backlight device for an LCD includes the semiconductor light emitting device 26 which is described in any one of the first through fourth embodiments, and an optical waveguide 9 for converting a dot light source or linear light source into surface light emission. Each of the light emitting elements 1 in the semiconductor light emitting device 26 is positioned on a linear line extending to the center of a light incident surface 9*a* (the center in a direction along a thickness of the optical waveguide). The light incident surface 9*a* is a side surface of the optical waveguide 9, and the linear line is parallel to edge lines of the optical waveguide 9 with respect to the direction along the thickness of the optical waveguide 9.

According to this arrangement, optical axes of light beams 14 emitted from the light emitting elements 1 can be set to be orthogonal to the light incident surface 9*a* of the optical waveguide 9. This prevents the light from being reflected by the optical waveguide 9*a*, thereby improving luminance efficiency of the light incident on the optical waveguide 9. As a result, brightness of the light incident from the light incident surface of the optical waveguide 9 is enhanced.

Figure 10:
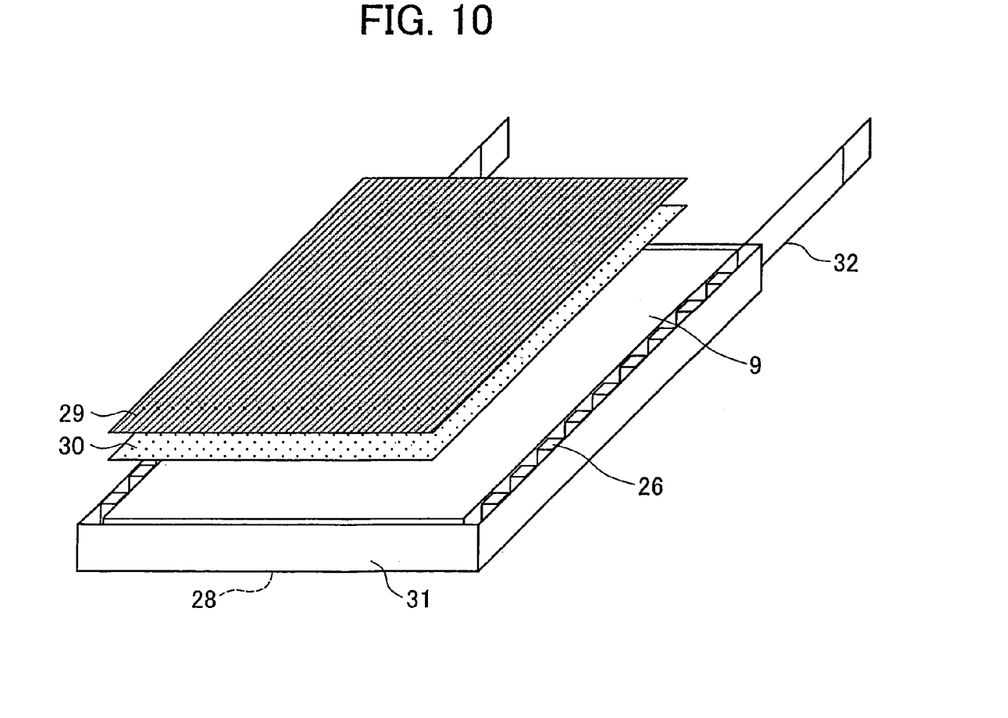
FIG. 10 is a perspective view of the backlight device.

As illustrated in FIG. 10, in the backlight device, a cover case (electric wiring substrate) 31, on which a plurality of the semiconductor light emitting devices 26 are mounted on a linear line, may be installed so as to surround side surfaces of the optical waveguide 9. To the cover case 31, electric power terminals 32 are attached.

Further, a reflecting sheet 28, which reflects light emitted from the optical waveguide 9 into the optical waveguide 9, may be attached to a rear side of the optical waveguide 9 (backside of the surface emission light outgoing side). Further, a diffusion sheet 30 for reducing uneven brightness of surface emission light from the optical waveguide 9 may be attached on a light outgoing surface of surface emission light from the optical waveguide 9. In addition, a brightness enhancement film 29 may be installed on the diffusion sheet 30.

In such a backlight device, light beams emitted from the semiconductor light emitting devices 26 are incident on the optical waveguide 9. Then, the light reflected by the reflecting sheet 28 or the like is transmitted through the diffusion sheet 30 and the brightness enhancement film 29 and the like, so as to be converted into the surface emission.

In this arrangement, by using the semiconductor light emitting devices 26 of the present invention, the light incident on the optical waveguide 9 will be more even in brightness. This is because the light emitting elements 1 are positioned on the center portion (center line) of the optical waveguide 9 as illustrated in FIG. 9. With conventional semiconductor light emitting devices, a positional distance between light emitting elements 51 causes variations of directional characteristics of emitted light as illustrated in FIG. 18. This reduces a luminance efficiency of light incident on an optical waveguide 77.

According to the present invention, light beams from the light emitting elements 1 in the semiconductor light emitting devices 26 are uniformed in their optical directional characteristics, thereby improving efficiency of light incident on the optical waveguide 9 used in a backlight device. Further, luminance efficiency when using fluorescent materials can be improved from the combination of the fluorescent material and the light emitting elements 1

In the semiconductor light emitting device 26 the package body 3 may include a second concave portion having the first concave portions on its bottom surface. In the semiconductor light emitting device 26, it is preferable that the light emitting elements be stored in the first concave portions so that optical axes of the light beams emitted from the light emitting elements will be parallel to each other.

In the semiconductor light emitting device 26 it is preferable that the light emitting elements be blue color light emitting elements 1*c*, and one of the plural first concave portions be set to pass blue light from the blue color light emitting element 1*c*, another one of the first concave portions be filled with a first fluorescent material emitting green light from blue light emitted from the blue color light emitting element 1*c*, and further, another one of the first concave portions be filled with a second fluorescent material emitting red light from blue light emitted from the blue color light emitting element 1*c*.

According to this arrangement, each of the fluorescent materials having individual colors will be constituted independently without being mixed, thereby realizing light emission of RGB full colors by using only one kind of the light emitting element, i.e., blue color light emitting elements.

In the semiconductor light emitting device, it is preferable that the light emitting elements be blue color light emitting elements; and one of the plural first concave portions be set to pass blue light from the blue color light emitting element, and another one of the first concave portions be filled with a third fluorescent material emitting yellow light from blue light emitted from the blue color light emitting element.

According to this arrangement, by avoiding mutual light absorption between the blue light and the yellow, and thereby extracting the blue light and the yellow light independently, white light having high luminance efficiency can be obtained from a mixture of both colors.

In the semiconductor light emitting device, it is preferable that the light emitting elements be ultraviolet light emitting elements, and one of the plural first concave portions be filled with a fourth fluorescent material emitting blue light from ultraviolet light emitted from the ultraviolet light emitting element, and another one of the first concave portions be filled with a fifth fluorescent material emitting green light from ultraviolet light emitted from the ultraviolet light emitting element, and further, another one of the first concave portions be filled with a sixth fluorescent material emitting red light from ultraviolet light emitted from the ultraviolet light emitting element.

According to this arrangement, by providing (introducing) (i) a resin in which the fluorescent material emitting blue light (B) is mixed, (ii) a resin in which the fluorescent material emitting green light (G) is mixed, and (iii) a resin in which the fluorescent material emitting red light (R) is mixed, into the first concave portions, respectively, without mixing the fluorescent materials themselves with each other, it is possible to extract each of the light beams having individual colors of RGB. Thus, high luminance efficiency of light emission is realized in RGB full colors.

In the semiconductor light emitting device, it is preferable that each of the first concave potions be filled with a first resin layer in which a seventh fluorescent material is mixed, and, over the first resin layer, a second resin section be provided, the second resin section being formed with an eighth fluorescent material having an excitation wavelength of a shorter interval than that of the seventh fluorescent material.

According to the arrangement, high luminance efficiency of emitted light is achieved because light emitted from the fluorescent material having an excitation wavelength of a short interval is prevented from being absorbed by a fluorescent material having another excitation wavelength of a long interval.

In the semiconductor light emitting elements, it is preferable that on inner side surfaces of the first concave portions, a reflecting layer for reflecting light be formed. According to this arrangement, by disposing reflecting layers, it is possible to increase a brightness of light emitted from the light emitting elements in the first concave portions toward the outside.

In the semiconductor light emitting elements, it is preferable that the inner side surfaces of the first concave portions be formed in a taper shape, whose opening has a larger diameter toward the outside. According to this arrangement, with the taper shape, it is possible to enhance a brightness of the light toward a front (from the openings of the first concave portions toward the outside).

In the semiconductor light emitting elements, it is one preference for the package substrate to be made of a ceramic material. In the semiconductor light emitting elements, it is another preference for the package substrate to be made of a resin. In the semiconductor light emitting elements, it is yet another preference for the package substrate to be made of a metal frame and a resin which holds the metal frame and reflects light.

Further, a backlight device for an LCD of the present invention includes a semiconductor light emitting device; and an optical waveguide for converting a dot light source and a linear light source to surface light emission, the semiconductor light emitting device including a plurality of light emitting elements; a package substrate having concave portions for storing the light emitting elements; and wiring patterns being electrically connected to the light emitting elements using connecting members, the concave portions having first concave portions for storing the respective light emitting elements; and a second concave portion for storing the first concave portions and the connecting members, the first concave portions being aligned on a linear line parallel to one edge portion of the package substrate and spaced from each other with an equal pitch, the light emitting elements of the semiconductor light emitting device being aligned on a linear line parallel to edge lines of the optical waveguide with respect to a direction along a thickness of the optical wave guide.

According to this arrangement, by using the semiconductor light emitting device, and aligning the light emitting elements of the semiconductor light emitting device on a linear line parallel to the edge lines of the optical waveguide with respect to the direction along the thickness of the optical waveguide, luminance efficiency of light incident on the optical waveguide is improved, thereby enhancing a brightness of light emitted from the optical waveguide.

It is preferable that the backlight device further include an electric wiring substrate, on which a plurality of the semiconductor light emitting devices are aligned; a reflecting sheet for reflecting light emitted from the optical waveguide into the optical waveguide; and a diffusion sheet for reducing unevenness in brightness of surface emission light from the optical waveguide.

As described above, the semiconductor light emitting device of the present invention includes a plurality of light emitting elements; a package substrate having first concave portions for storing the respective light emitting elements; wiring patterns for performing electrical connections to the light emitting elements, the wiring patterns provided in the respective first concave portions; connecting members for electrically connecting the wiring patterns and the light emitting elements, respectively; and a second concave portion for storing the first concave portions and the connecting members, the first concave portions being aligned on a linear line and spaced from each other with an equal pitch.

Thus, because the first concave portions are aligned on a linear line and spaced from each other with an equal pitch, when the semiconductor light emitting device is installed to an optical waveguide of the backlight device, luminance efficiency of the light beams incident on the optical waveguide can be improved. This is because the light beams have reduced gradients with respect to a light incident surface of the optical waveguide, thereby entering the optical waveguide at an approximately square angle from the light incident surface of the optical waveguide.

As a result, in the foregoing structure, the luminance efficiency of the light beams incident on the optical waveguide can be improved. This facilitates the guiding of more amounts of light into the optical waveguide, and enhances a brightness of the light beams departing from the optical waveguide. Thus, in a backlight device for an LCD, it is possible to set a high brightness of image display in the LCD, thereby improve a quality of the image display.

As described above, the backlight device for an LCD of the present invention includes (i) the semiconductor light emitting device, in which the first concave portions for storing plural light emitting elements are aligned on a linear line and spaced from each other with an equal pitch, and (ii) the optical waveguide for converting a dot light source or linear light source into surface emission. The light emitting elements in the semiconductor light emitting device are aligned on a linear line parallel to the edge lines of the optical waveguide with respect to a direction along thickness of the optical waveguide.

Thus, in the above arrangement, by using the semiconductor light emitting device, and aligning the light emitting elements in the semiconductor light emitting device on a linear line parallel to the edge lines of the optical waveguide with respect to the direction along the thickness of the optical waveguide, luminance efficiency of light incident on the optical waveguide is improved, thereby enhancing a brightness of light emitted from the optical waveguide.

As a result, in the foregoing structure, the luminance efficiency of the light beams incident on the optical waveguide can be improved. This facilitates the guiding of more amounts of light into the optical waveguide, and enhances a brightness of the light beams emitted from the optical waveguide to the LCD. Thus, the semiconductor light emitting device of the present invention improves quality of the image display on the LCD.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor light emitting device for surface emission comprising:
    a plurality of light emitting elements;
    a package substrate for storing the light emitting elements;
    a plurality of wiring patterns, each pattern being electrically connected to a corresponding one of the plurality of light emitting elements; and
    connecting members for electrically connecting the light emitting elements to the wiring patterns,
    the package substrate having:
    a plurality of first concave portions for storing the respective light emitting elements; and
    a second concave portion for storing the plurality of the first concave portions and the connecting members,
    the first concave portions being aligned on a linear line and spaced from each other with an equal pitch,
    wherein the plurality of wiring patterns are arranged on a surface of the second concave portion,
    the first concave portions being spaced equally, at a first distance, from a pair of first inner walls of the second concave portion, respectively, the first inner walls facing each other and being located along a long side of the package substrate,
    the first concave portions located closest to a pair of second inner walls of the second concave portion being spaced equally, at a second distance, from the pair of second inner walls corresponding to the respective first concave portions, the second inner walls facing each other and being located along a short side of the package substrate.

2. A semiconductor light emitting device according to claim 1,
    wherein the light emitting elements are blue color light emitting elements, and
    wherein one of the plural first concave portions is set to pass blue light from the blue color light emitting element, another one of the first concave portions is filled with a first fluorescent material emitting green light from blue light emitted from the blue color light emitting element, and further, another one of the first concave portions is filled with a second fluorescent material emitting red light from blue light emitted from the blue color light emitting element.

3. A semiconductor light emitting device according to claim 1,
    wherein the light emitting elements are blue color light emitting elements, and
    wherein one of the plural first concave portions is set to pass blue light from the blue color light emitting element, and another one of the first concave portions is filled with a third fluorescent material emitting yellow light from blue light emitted from the blue color light emitting element.

4. The semiconductor light emitting device according to claim 1, wherein, on inner side surfaces of the first concave portions, a reflecting layer for reflecting light is formed.

5. The semiconductor light emitting device according to claim 1, wherein the inner side surfaces of the first concave portions are formed in a taper shape, whose opening has a larger diameter toward the outside.

6. The semiconductor light emitting device according to claim 1, wherein the package substrate is made of a ceramic material.

7. The semiconductor light emitting device according to claim 1, wherein the package substrate is made of a resin.

8. The semiconductor light emitting device according to claim 1, wherein the package substrate is made of a metal frame and a resin which holds the metal frame and reflects light.

9. A semiconductor light emitting device for surface emission comprising:
    a plurality of light emitting elements;
    a package substrate for storing the light emitting elements;
    a plurality of wiring patterns, each pattern being electrically connected to a corresponding one of the plurality of light emitting elements; and
    connecting members for electrically connecting the light emitting elements to the wiring patterns, the package substrate having:
    a plurality of first concave portions for storing the respective light emitting elements; and
    a second concave portion for storing the plurality of the first concave portions and the connecting members,
    each of the first concave portions being aligned on a linear line parallel to one edge portion of the package substrate and spaced from each other with an equal pitch,
    wherein the plurality of wiring patterns are arranged on a surface of the second concave portion,
    the first concave portions being spaced equally, at a first distance, from a pair of first inner walls of the second concave portion, respectively, the first inner walls facing each other and being located along a long side of the package substrate,
    the first concave portions located closest to a pair of second inner walls of the second concave portion being spaced equally, at a second distance, from the pair of second inner walls corresponding to the respective first concave portions, the second inner walls facing each other and being located along a short side of the package substrate.

10. The semiconductor light emitting device according to claim 9,
    wherein the light emitting elements are blue color light emitting elements, and
    wherein one of the plural first concave portions is set to pass blue light from the blue color light emitting element, another one of the first concave portions is filled with a first fluorescent material emitting green light from blue light emitted from the blue color light emitting element, and further, another one of the first concave portions is filled with a second fluorescent material emitting red light from blue light emitted from the blue color light emitting element.

11. The semiconductor light emitting device according to claim 9,
    wherein the light emitting elements are blue color light emitting elements, and
    wherein one of the plural first concave portions is set to pass blue light from the blue color light emitting element, and another one of the first concave portions is filled with a third fluorescent material emitting yellow light from blue light emitted from the blue color light emitting element.

12. The semiconductor light emitting device according to claim 9, wherein, on inner side surfaces of the first concave portions, a reflecting layer for reflecting light is formed.

13. The semiconductor light emitting device according to claim 9, wherein the inner side surfaces of the first concave portions are formed in a taper shape, whose opening has a larger diameter toward the outside.

14. The semiconductor light emitting device according to claim 9, wherein the package substrate is made of a ceramic material.

15. The semiconductor light emitting device according to claim 9, wherein the package substrate is made of a resin.

16. The semiconductor light emitting device according to claim 9, wherein the package substrate is made of a metal frame and a resin which holds the metal frame and reflects light.

17. A backlight device for a liquid crystal display comprising:
a semiconductor light emitting device; and
an optical waveguide for converting a dot light source or a linear light source into surface emission,
the semiconductor light emitting device having:
a plurality of light emitting elements;
a package substrate for storing the light emitting elements;
a plurality of wiring patterns, each pattern being electrically connected to a corresponding one of the plurality of light emitting elements; and
connecting members for electrically connecting the light emitting elements to the wiring patterns,
the package substrate including:
a plurality of first concave portions for storing the respective light emitting elements; and
a second concave portion for storing the plurality of the first concave portions and the connecting member, and
the first concave portions being aligned on a linear line and spaced from each other with an equal pitch,
the light emitting elements of the semiconductor light emitting device being aligned on a linear line parallel to edge lines of the optical waveguide with respect to a direction along a thickness of the optical waveguide,
wherein the plurality of wiring patterns are arranged on a surface of the second concave portion,
the first concave portions being spaced equally, at a first distance, from a pair of first inner walls of the second concave portion, respectively, the first inner walls facing each other and being located along a long side of the package substrate,
the first concave portions located closest to a pair of second inner walls of the second concave portion being spaced equally, at a second distance, from the pair of second inner walls corresponding to the respective first concave portions, the second inner walls facing each other and being located along a short side of the package substrate.

18. The backlight device for a liquid crystal display according to claim 17, further comprising:
an electric wiring substrate, on which a plurality of the semiconductor light emitting devices are aligned;
a reflecting sheet for reflecting light emitted from the optical waveguide into the optical waveguide; and
a diffusion sheet for reducing unevenness in brightness of surface emission light from the optical waveguide.

19. The semiconductor light emitting device according to claim 1, wherein:
the first concave portions have an inner bottom surface which is substantially parallel to a surface of the substrate.

20. The semiconductor light emitting device according to claim 1, wherein:
the first concave portions have a round-shaped inner bottom surface.

21. The semiconductor light emitting device according to claim 20, wherein:
each of the light emitting elements is mounted on the inner bottom surface of each of the first concave portions.

22. The semiconductor light emitting device according to claim 21, wherein:
an optical axis of a light beam emitted from each of the light emitting elements is on a center axis of each of the inner bottom surface.

23. The semiconductor light emitting device according to claim 1, wherein:
a depth of each of the first concave portions is greater than a height of each of the light emitting elements.

24. The semiconductor light emitting device according to claim 9, wherein:
the first concave portions have an inner bottom surface which is substantially parallel to a surface of the substrate.

25. The semiconductor light emitting device according to claim 9, wherein:
the first concave portions have a round-shaped inner bottom surface.

26. The semiconductor light emitting device according to claim 25, wherein:
each of the light emitting elements is mounted on the inner bottom surface of each of the first concave portions.

27. The semiconductor light emitting device according to claim 26, wherein:
an optical axis of a light beam emitted from each of the light emitting elements is on a center axis of each of the inner bottom surface.

28. The semiconductor light emitting device according to claim 9, wherein:
a depth of each of the first concave portions is greater than a height of each of the light emitting elements.

29. The backlight device for a liquid crystal display according to claim 17, wherein:
the first concave portions have an inner bottom surface which is substantially parallel to a surface of the substrate.

30. The backlight device for a liquid crystal display according to claim 17, wherein:
the first concave portions have a round-shaped inner bottom surface.

31. The backlight device for a liquid crystal display according to claim 30, wherein:
each of the light emitting elements is mounted on the inner bottom surface of each of the first concave portions.

32. The backlight device for a liquid crystal display according to claim 31, wherein:
an optical axis of a light beam emitted from each of the light emitting elements is on a center axis of each of the inner bottom surface.

33. The backlight device for a liquid crystal display according to claim 17, wherein:
a depth of each of the first concave portions is greater than a height of each of the light emitting elements.

34. The semiconductor light emitting device according to claim 1, wherein the second distance is greater than or equal to the first distance.

35. The semiconductor light emitting device according to claim 9, wherein the second distance is greater than or equal to the first distance.

36. The backlight device for a liquid crystal display according to claim 17, wherein the second distance is greater than or equal to the first distance.

37. The semiconductor light emitting device according to claim 1, wherein the second distance is equal to the first distance.

38. The semiconductor light emitting device according to claim 9, wherein the second distance is equal to the first distance.

39. The backlight device for a liquid crystal display according to claim 17, wherein the second distance is equal to the first distance.

* * * * *